United States Patent
Imhof (10) Patent No.: US 9,846,188 B2
(45) Date of Patent: Dec. 19, 2017

(54) DETECTING, LOCALIZING AND RANKING COPPER CONNECTORS

(71) Applicant: Fluke Corporation, Everett, WA (US)

(72) Inventor: Michael Imhof, Bothell, WA (US)

(73) Assignee: Fluke Corporation, Everett, WA (US)

( * ) Notice: Subject to any disclaimer, the term of this patent is extended or adjusted under 35 U.S.C. 154(b) by 632 days.

(21) Appl. No.: 14/489,548

(22) Filed: Sep. 18, 2014

(65) Prior Publication Data

US 2016/0084895 A1    Mar. 24, 2016

(51) Int. Cl.
| | |
|---|---|
| *G01R 27/28* | (2006.01) |
| *G01R 31/02* | (2006.01) |
| *G01R 31/11* | (2006.01) |

(52) U.S. Cl.
CPC .......... *G01R 27/28* (2013.01); *G01R 31/021* (2013.01); *G01R 31/11* (2013.01)

(58) Field of Classification Search
CPC ....... G01R 27/28; G01R 31/021; G01R 31/11
USPC .............. 702/58, 75, 79; 324/520, 533, 628; 370/250
See application file for complete search history.

(56) References Cited

U.S. PATENT DOCUMENTS

| | | | |
|---|---|---|---|
| 6,433,558 B1 | 8/2002 | Sciacero et al. | |
| 7,295,018 B2 | 11/2007 | Oakley | |
| 2002/0163340 A1* | 11/2002 | Sciacero | ............... G01R 31/11 324/520 |
| 2013/0242760 A1* | 9/2013 | Peyton | ................... H04Q 1/136 370/250 |

FOREIGN PATENT DOCUMENTS

GB    2503636    1/2014

OTHER PUBLICATIONS

Extended European Search Report for European Patent Application No. 15185558.2, dated Feb. 24, 2016.

* cited by examiner

*Primary Examiner* — John H Le
(74) *Attorney, Agent, or Firm* — Locke Lord LLP; Scott D. Wofsy; Christopher J. Capelli (57) ABSTRACT

A method for detecting failures in electrical cable assemblies is provided. A cable test instrument obtains frequency domain data representing electrical characteristics of a cable link under test. A number of connectors in the cable link under test is determined based on the obtained frequency domain data. An estimated location of each of the connectors along the length of the cable link under test is determined by the cable test instrument. The connectors are ranked in accordance with their respective contribution to detected failures in the cable link under test.

14 Claims, 9 Drawing Sheets

DETECTING, LOCALIZING AND RANKING COPPER CONNECTORS

FIELD OF THE INVENTION

Embodiments of the present invention relate to cable fault measurements and, more particularly, to detecting, localizing and ranking faulty copper connectors.

BACKGROUND OF THE INVENTION

In testing and troubleshooting electrical cables a typical test involves using test instruments that transmit stimulus signals into one end of a cable and receive and measure any reflections that return. Both time-domain reflectometry (TDR) and time-domain crosstalk (TDX) measurements are subject to two major types of problems. One is attempting to identify all modes of failure and the other is attempting to identify all time domain events. These problems typically introduce many false positive results and often hinder attempts to locate connectors.

As data transmission rates have steadily increased, modular connectors with improved crosstalk performance have been designed to meet the increasingly demanding standards. In particular, recent connectors have introduced predetermined amounts of crosstalk compensation to cancel offending near end crosstalk (NEXT). As a result, TDX measurements no longer can robustly detect all connector faults in the cable.

SUMMARY OF THE INVENTION

The purpose and advantages of the illustrated embodiments will be set forth in and apparent from the description that follows. Additional advantages of the illustrated embodiments will be realized and attained by the devices, systems and methods particularly pointed out in the written description and claims hereof, as well as from the appended drawings.

In accordance with a purpose of the illustrated embodiments, in one aspect, a method for detecting failures in electrical cable assemblies is provided. A cable testing instrument obtains frequency domain data representing electrical characteristics of a cable link under test. A number of connectors in the cable link under test is determined based on the obtained frequency domain data. An estimated location of each of the connectors along the length of the cable link under test is determined by the cable testing instrument. The connectors are ranked in accordance with their respective contribution to detected failures in the cable link under test.

BRIEF DESCRIPTION OF THE DRAWINGS

The accompanying appendices and/or drawings illustrate various, non-limiting, examples, inventive aspects in accordance with the present disclosure.

DETAILED DESCRIPTION OF CERTAIN EMBODIMENTS

The present invention is now described more fully with reference to the accompanying drawings, in which illustrated embodiments of the present invention are shown wherein like reference numerals identify like elements. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

It is to be appreciated the embodiments of this invention as discussed below are preferably a software algorithm, program or code residing on computer useable medium having control logic for enabling execution on a machine having a computer processor. The machine typically includes memory storage configured to provide output from execution of the computer algorithm or program.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the equations, relationships and algorithms described below. One skilled in the art will appreciate further features and advantages of the invention based on the below-described embodiments. Accordingly, the invention is not to be limited by what has been particularly shown and described, except as indicated by the appended claims.

In one aspect, various embodiments of the present invention provide a method for detecting failures in electrical cable assemblies. This method includes determining the number of connectors present in the cable link under test, their positions along the length of the cable link and their ranking in accordance with their respective contribution to detected failures in the cable link under test. Given this information, according to an embodiment of the present invention, an "event map" of the tested link may be generated. The generated event map graphically represents the topology of the link along with any additional failure diagnostic information that can be inferred from fault indicators, for example. In a preferred embodiment, the event map illustrates the likely causes of one or more failures in the link under test and their estimated positions along the link, where applicable.

Figure 1:
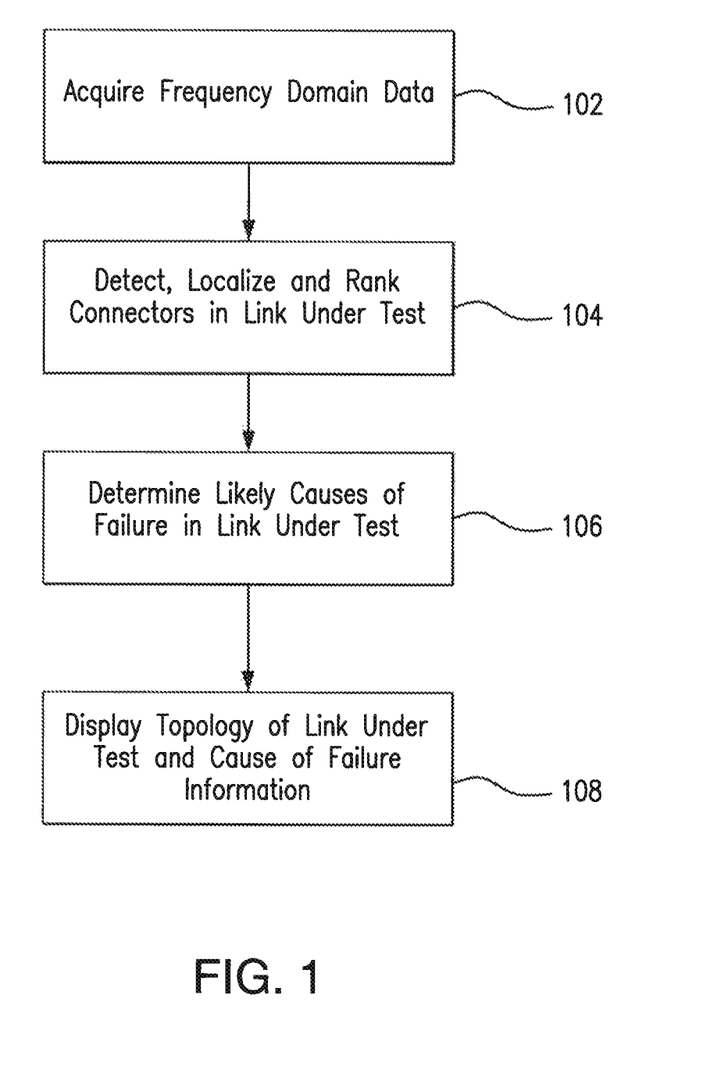
FIG. 1 is a high level flowchart of operational steps for carrying out the failure detection method, in accordance with an illustrative embodiment of the present invention.

Referring to FIG. 1 of the drawings, FIG. 1 is a high level flowchart of operational steps for carrying out the failure detection method, in accordance with an illustrative embodiment of the present invention. At step 102, a frequency-based cable test instrument synthesizes a virtual stimulus by sending a series of sinusoidal frequencies, or "tones", into a cable link under test. Reflected responses are received as the frequency domain data.

In one embodiment, collected frequency domain data may be represented by s-parameters. The s-parameters comprise a set of parameters that describe the scattering and reflection of traveling electromagnetic waves that occur in a link under test. The s-parameters are normally measured as a function of frequency, the measurement representing a complex gain (i.e., magnitude and/or phase). Accordingly, s-parameters are often termed complex scattering parameters. The s-parameters can be used to accurately describe the electronic behavior of a link under linear conditions in the microwave frequency range.

The frequency domain is the best domain to collect this information as it can be measured with high Signal-to-Noise Ratio (SNR) leading to accurate results. In a particular embodiment of the present invention, two test instruments may be provided, with a first test instrument (generally referred to hereinafter as a "main unit" or simply as a "test instrument) connected to one end of the link under test, and a second test instrument (generally referred to hereinafter as a "remote unit") connected to the other end of the link under test. It is noted that both the first and second test instruments may comprise portable or hand held test instruments. The main and remote units may cooperate to effect testing, and may comprise either both active test instruments or an active and more passive test instrument, with the active instrument (e.g., main unit) controlling the testing, and the more passive instrument providing measurement results back to the active instrument.

In one embodiment, the frequency domain data acquired by the main and remote units in step 102 may include NEXT measurements and Common-to-Differential NEXT (CD-NEXT) measurements on both the main and remote units. Distortion, such as crosstalk, is a common impairment in communication systems. NEXT refers to the undesirable coupling of a signal transmitted in one direction into the signal transmitted in the opposite direction. NEXT is important as it represents the domain in which connectors have the largest impact on performance and may cause a test failure. However, due to manufacturing improvements in NEXT over the years, it has become more and more difficult to detect connectors via measurement of NEXT alone. In particular, recent connectors have introduced predetermined amounts of crosstalk compensation to cancel offending NEXT.

The present inventor discovered that empirically connectors exhibit distinctive performance in CDNEXT measurements. Therefore, in a preferred embodiment, CDNEXT measurements can be used for connector detection purposes. CDNEXT concepts are discussed below with reference to FIG. 3. While a reliable detection of connector faults method in the link under test requires NEXT and CDNEXT measurement points, in various embodiments, other frequency domain data may also be gathered at step 102 by the main and/or remote units for use in fault diagnosis.

Referring back to FIG. 1, at step 104, the main unit may detect, localize and rank connectors in the link under test. Each of these sub-steps is discussed in greater detail below with reference to FIG. 4. The end result of step 104 may represent a diagnostic list of connectors detected in the link. This list of connectors may be sorted in accordance with their respective contribution to detected failures in the link under test. At 106, all detected failures may be analyzed to determine the most likely causes for each of the failures. In one embodiment, the analysis may be based on empirical knowledge, which may be stored in a knowledge-based system. For example, Technical Assistance Center (TAC) agents may have extensive experience debugging failed links. TAC agents' experiential knowledge may be acquired and encoded in the knowledge-based system. In one embodiment, an analysis of the knowledge-based system may be handled by an inference engine using well-known reasoning techniques such as Model Based Reasoning, Rule Based Reasoning or Case Based Reasoning. The inference engine may attempt to determine the most likely causes of each failure and, given this information, may attempt to localize these faults (if possible). For instance, the root cause of failure may be a damaged cable in a link with multiple segments. The inference engine or another suitable knowledge-based system may attempt to determine which segments are problematic in this instance. The end result of step 106 is a list of the most likely causes of failure as well as the location of localizable failures.

At step 108, a graphical representation of topology of the link under test may be presented to a user, for example, via a graphical user interface of the main unit. This graphical representation may be based on information acquired at step 102 and based on the analysis preformed at steps 104 and 106. In one embodiment, distance values may be displayed, representing the distance from the test instrument to the various located events, as well as connector information and fault information related to connectors along the link under test. Link topology information may also include the failure list generated at step 106.

Figure 2:
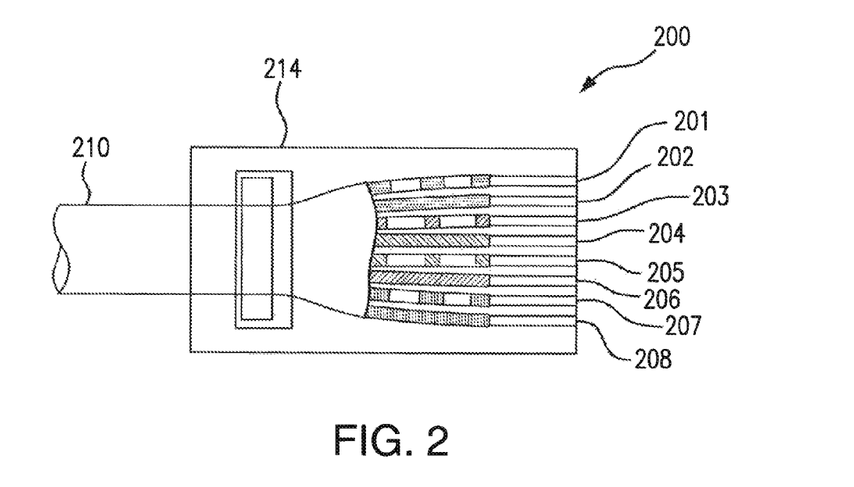
FIG. 2 a diagram illustrating an exemplary RJ-45 connector type in accordance with the prior art.

Various embodiments of the present invention apply in particular to RJ-45 connectors. The description given hereinafter concerns this type of connector. However, the present invention is not limited to this type of connector and may be extended to other types of suitable cable connectors. A conventional RJ-45 connector 200 is shown in FIG. 2. Such a connector 200 is common in computer networking, and consists of a cable 210 which contains eight wires and terminates in a plastic or metal housing or plug 214. More specifically, the eight wires 201-208 terminate at pins which are exposed at the end of the plug 214. The wires 201-208 (and corresponding pins) are numbered 1 through 8. The plug 214 is insertable in a corresponding receptacle, and causes the pins on the connector 200 to conductively contact corresponding pins in the receptacle. The overall structure and operation of an RJ45 connector is well known in the art. FIG. 2 shows that one pair of wires, referred to hereinafter as a first pair, 204,205 is centrally positioned and a second pair 203,206 straddles the first pair 204,205. Due to this unique geometry, the first pair 204,205 and second pair 203,206 are the critical areas for the worst cross talk problems in the link under test. However, for CDNEXT, the arrangement of RJ-45 connector 200 results in different performance across the pairs due to the reasons explained below.

Figure 3:
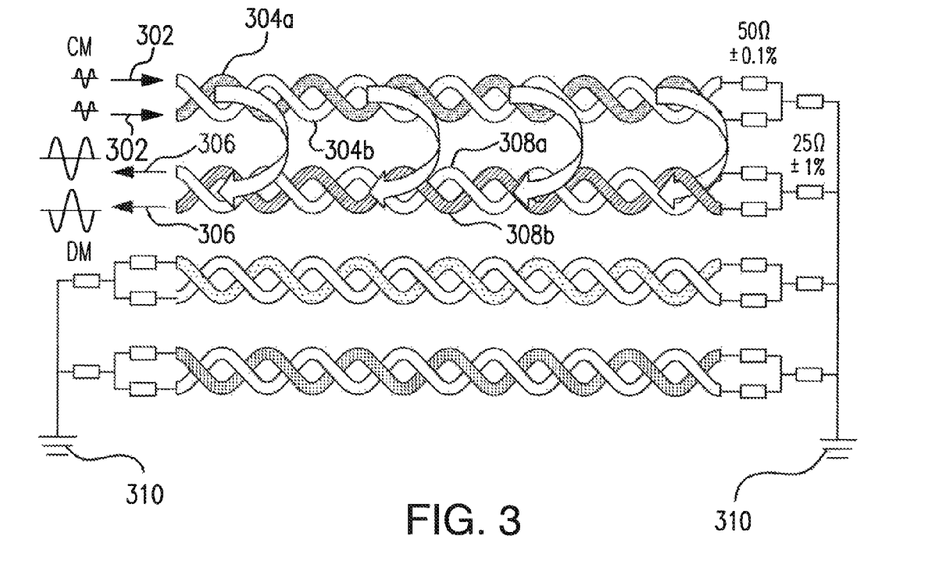
FIG. 3 is a diagram illustrating a Common-to-Differential Near-End Crosstalk (CDNEXT) signal path, in accordance with an embodiment of the present invention.

FIG. 3 is a diagram illustrating a CDNEXT signal path in accordance with an embodiment of the present invention. For purposes of the present invention, CDNEXT is defined as generating a Common Mode (CM) signal 302 on one pair 304*a-b* and measuring a Differential Mode (DM) signal 306 on a different pair 308*a-b* on the same end. A person of skill in the art should recognize an important difference between NEXT and CDNEXT. For NEXT, there are only 6 unique pair combinations due to the symmetric geometry. For example, pairs 201,202-203,206 and 203,206-201,202 are equivalent with respect to NEXT measurements. However, this assumption cannot be made for CDNEXT since the generated and received modes are not the same (the former is CM signal 302 and the latter is DM signal 306). Therefore, there are 12 unique combinations for CDNEXT. Generally, for cables, there is no one particular pair that always shows the worst case performance as the geometry in cables is constantly changing down the length of the cable. However, this is not true with respect to RJ-45 connectors.

Due to a common mode input signal 302, the majority of the crosstalk between pairs 304 and 308 is made up of common mode signal. The output is a differential signal 306, which means that if the crosstalk is similar between the output wires 308*a* and 308*b*, the measured crosstalk will be small. Conversely, if the crosstalk is very different between the output wires 308*a* and 308*b*, the measured crosstalk will be large. Referring back to FIG. 2, said observation means that pairs 201,202-203,206 and 207,208-203,206 (by symmetry) will necessarily have the largest amount of CDNEXT in the RJ-45 connector 200 because the 203,206 pair has the largest distance between the wires of any pair and will therefore have the largest difference in the crosstalk received on each wire. This also means that 203,206-204,205 will necessarily have the smallest amount of CDNEXT which is directly opposite of the NEXT results described above with reference to FIG. 2. Empirical studies have shown that with respect to time domain and in reference to connector related peak values against so called "noise floor" set by crosstalk in the cable itself, CDNEXT has better SNR than NEXT in the majority of cases. Accordingly, various embodiments of the present invention utilize CDNEXT measurements for connector detection purposes, as described below.

Figure 4:
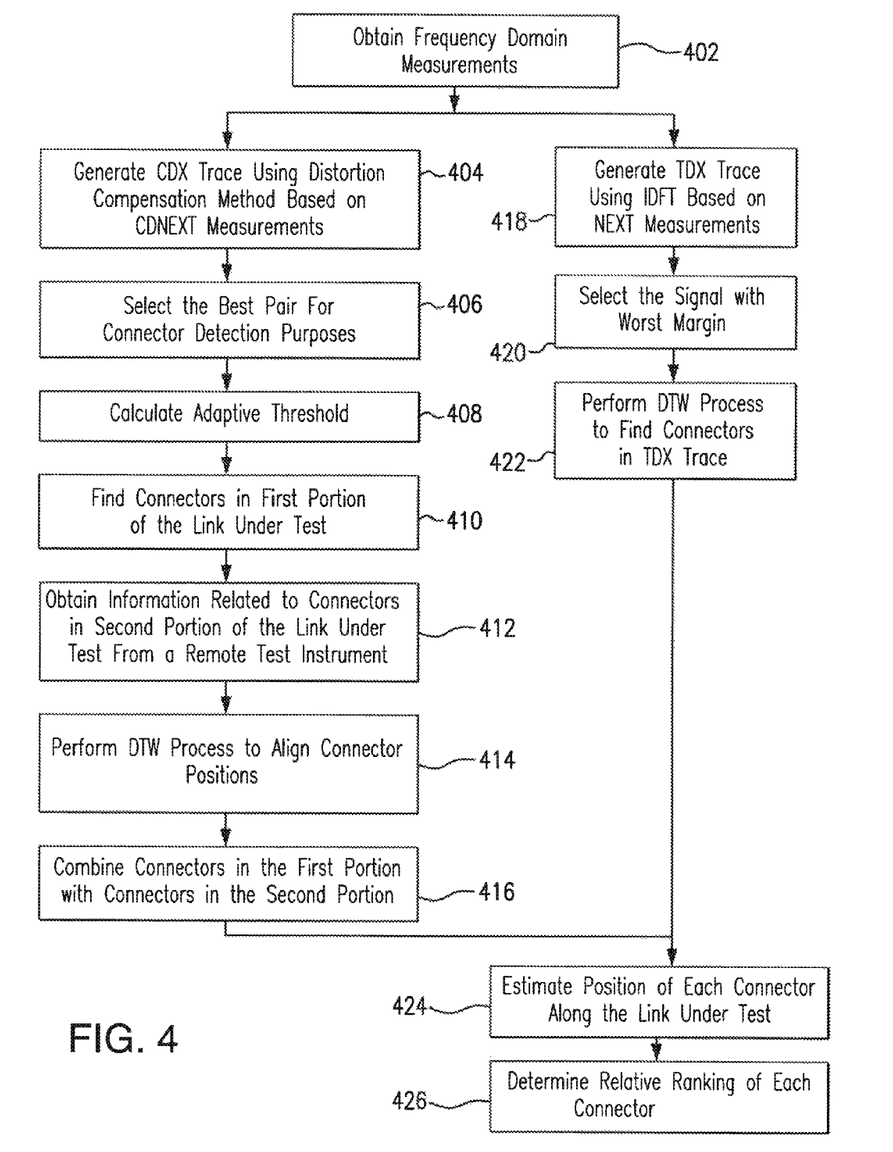
FIG. 4 is a detailed flowchart of connector detection, localization and ranking step in FIG. 1, in accordance with an illustrative embodiment of the present invention.

FIG. 4 is a detailed flowchart of connector detection, localization and ranking corresponding to step 104 in FIG. 1, in accordance with an illustrative embodiment of the present invention. Before turning to description of FIG. 4, it is noted that the flow diagram in FIG. 4 shows example in which operational steps are carried out in a particular order, as indicated by the lines connecting the blocks, but the various steps shown in this diagram can be performed in any order, or in any combination or sub-combination. It should be appreciated that in some embodiments some of the steps described below may be combined into a single step. In some embodiments, one or more steps may be omitted. In some embodiments, one or more additional steps may be included. As will be appreciated by one skilled in the art, aspects of the present invention may be embodied as a method or computer program product. Accordingly, aspects of the present invention may take the form of an entirely software embodiment. Furthermore, aspects of the present invention may take the form of a computer program product embodied in one or more computer readable medium(s) having computer readable program code embodied thereon. In one embodiment, the program code may execute entirely on the cable test instrument (e.g., main unit).

At step 402, frequency domain data in the form of frequency domain NEXT and CDNEXT measurements may be obtained by a test instrument. This step at least partially overlaps with step 102 of FIG. 1 and is included in FIG. 4 for ease of illustration. Generally, there is an inherent lack of localization information in the frequency domain data as it represents a weighted sum over all time points for each frequency. Therefore, various embodiments of the present invention contemplate transforming the frequency domain data to the time domain in order to localize connectors. The traditional method for changing between the frequency and time domains is the Inverse Discrete Fourier Transform (IDFT). Typically, this transform is implemented using well-known Inverse Fast Fourier Transform (IFFT). However, some parts of the frequency domain data may have to be corrected because distortion exists in the frequency domain data in the form of attenuation and dispersion due to the natural characteristics of copper cable. In one embodiment of the present invention, the test instrument may utilize a distortion compensation method, described below in conjunction with step 404, which advantageously converts frequency domain measurements to the time domain measurements and in the process, corrects for distortions leading to traces that may be analyzed for localized information. Traditionally, this distortion compensation method has been applied to calculate Return Loss (RL) and NEXT of events which produce corresponding TDR waveform trace and TDX waveform trace, respectively. However, according to embodiments of the present invention, the same technique may be applied to CDNEXT measurements to produce a Common-to-Differential Crosstalk (CDX) waveform trace which may be utilized for connector detection.

At step 404, the test instrument may generate a CDX trace using distortion compensation method based on acquired CDNEXT measurements. The distortion compensation method will be illustrated below using a mathematic model.

In one embodiment, the test instrument may use a swept sine approach with amplitude of 1 and frequency ranging from 1 MHz up to a current maximum of 1200 MHz. This is, in essence, an approximation of an impulse in the time domain. In other words, the frequency domain can be considered as unity over the frequencies of interest, approximating white noise (which is unity over all frequencies). In addition, it is well known that $$F^{-1}\{1\}=\delta(t) \tag{1}$$

where $F^{-1}$ represents an inverse Fourier transform and $\delta(t)$ is a Dirac delta (impulse) in the time domain. It is therefore the case that, because not all frequencies are represented and that an IDFT is used, a swept sine input approximates an impulse response. Under the assumption of linearity, the output Y(f), given an input X(f), is a scaled and phase-shifted version of X(f) at each frequency f. Therefore, under this assumption, a swept sine input will yield the desired output Y(f).

It should be noted that to obtain the transfer function R(f) of the link under test in the frequency domain, the output of a linear system is the multiplication of the input by the transfer function of the system. Mathematically, the transfer function can be retrieved through $$Y(f) = R(f)X(f) \Rightarrow R(f) = \frac{Y(f)}{X(f)} \approx Y(f) \qquad (2)$$

where the last equality is asserted under the assumption that that $X(f) \approx 1$. Furthermore, R(f) can be represented as $$R(f) = Y(f) = \qquad (3)$$
$$\sum_{k=0}^{N-1} \Gamma(k)e^{-2ky(f)} = \Gamma(0) + \Gamma(1)e^{-2y(f)} + \ldots + \Gamma(N-1)e^{-2(N-1)y(f)}$$

where $\Gamma(k)$ is the crosstalk coefficient at time point k and y(f) is the propagation constant at frequency f. The propagation constant represents a distortion due to the natural characteristics of the link under test and is made up of $y(f)=\alpha(f)+j\beta(f)$, where $\alpha(f)$ is the attenuation constant, $\beta(f)$ is the phase constant, and j is the imaginary unit=$\sqrt{-1}$.

While the distortion has a natural occurrence in the link under test, for detection purposes, it is necessary to retrieve the underlying undistorted crosstalk coefficients $\Gamma(k)$. In other words, it is desirable to view the undistorted crosstalk coefficients as a function of time (or distance). To obtain this result, it is noted that in equation (3) above the first index is an undistorted crosstalk coefficient $\Gamma(0)$ while the remainder of the indices are in some form distorted by $e^{-2ky'(f)}$. To compensate for the distortion, the transfer function R(f) can be multiplied by $e^{2y(f)}$, which leads to the following equation:

$$R(f)e^{2y(f)}=\Gamma(0)e^{2y(f)}+\Gamma(1)+\ldots+\Gamma(N-1)e^{-2(N-2)y(f)} \qquad (4)$$

This transformation can be seen as shifting the crosstalk coefficients such that $\Gamma(1)$ is shifted to time index k=0. Furthermore, this transformation can be achieved for each time index k=0, 1, . . . , N−1. To actually isolate and retrieve the crosstalk coefficients, the IDFT can be used which results in the following:

$$x(t) = \frac{1}{N}\sum_{l=0}^{N-1} X(l)e^{j\frac{2\pi}{N}lt} \qquad (5)$$

However, for each time index k, only the effects from the time point at t=0 are needed for the purposes of this method. Therefore, the crosstalk coefficients can be obtained by:

$$\Gamma(k) = \frac{1}{N}\sum_{l=0}^{N-1} \operatorname{Re}\{R(l)e^{2ky(f)}\} \qquad (6)$$

for k=0, 1, . . . , N−1, where Re $\{\bullet\}$ is the real operator. Equation (6) can be rationalized as performing an IDFT for each value of k and only keeping the first point. Equation (6) can also be represented in matrix form as a matrix multiplication (in the same way an IDFT can be represented as a matrix multiplication), $$\Gamma(k) = \frac{1}{N}C(f)R(f) \qquad (7)$$

where C(f) is the compensation matrix:

$$C(f) = \begin{bmatrix} e^{y_1 x_1} & \cdots & e^{y_m x_1} \\ \vdots & \ddots & \vdots \\ e^{y_1 x_n} & \cdots & e^{y_m x_n} \end{bmatrix} \in \mathbb{C}^{n \times m} \qquad (8)$$

It should be noted that m may not necessarily be equal to n, but rather may be equal to n/2. The result of this is approximately equivalent to doing a Hilbert transform of $\Gamma(k)$:

$$H\{\Gamma(k)\}=\Gamma(k)+j\Gamma_1(k) \qquad (9)$$

where H denotes a Hilbert transform and $F_1(k)$ is a 90° phase-shifted version of $\Gamma(k)$. It is noted that $\Gamma(k)$ can be found through the use of the real operator Re $\{\bullet\}$. The rationale behind the assertion expressed in equation (9) is the definition of the Hilbert transform which considers the positive frequencies only and effectively zeros out the negative frequencies. Therefore, the compensation equation becomes:

$$\Gamma(k) = \frac{1}{N}\operatorname{Re}\{C(f)R(f)\} \qquad (10)$$

The compensation equation (10) can be refined further to produce a more palatable waveform. Since, as indicated above, frequencies may go up to 1200 MHz, it would be desirable to evaluate only the lower frequency "character" of the waveform and disregard the higher frequency "details" which may have substantially large variance. Therefore, it is preferable to consider only a smaller subset of frequencies, ranging, for example, from approximately 1 MHz up to approximately 400 MHz. The effect of higher frequencies on the end result can be further reduced (while maintaining resolution) through the use of tapering (or windowing).

A Fourier transform is a mathematical method of converting an infinitely long, or repetitive, time domain signal into a frequency domain spectrum—a sum of a set of sine waves. A Discrete Fourier Transform (DFT) is a mathematical method of estimating the frequency domain power spectrum of an infinitely long signal, based on a finite length piece of the signal, represented by a finite number of samples of the signal waveform. An IDFT is a method of estimating a time-domain waveform, from a finite set of frequency domain samples covering a finite bandwidth. In either case, i.e. DFT or IDFT, artifacts or errors are made in the process due to the finite nature of the data. In the case of the DFT, sidelobes appear that are caused largely by the abrupt ends of the finite data set. In the case of the IDFT, the time-domain waveform exhibits blurring as well as erroneous peaks and ringing.

The classic way of reducing sidelobes is to taper the data set so that the data amplitudes are dropping toward zero at the ends of the finite data. The various classic window taper types, like Rectangular, Hann, Hamming, Blackman, Nutall, Kaiser, Chebyshev (lowest sidelobes but poorest resolution), represent different tradeoffs between resolution and sidelobe levels. In a preferred embodiment, the Blackman taper type may be utilized. Tapering the data is important as there is inherent periodicity in a data record when using a DFT. If the end points do not align, there is a perceived discontinuity between the end points, causing spectral leakage in the frequency domain (also known as bias). This bias tends to dump energy across a wide range of frequencies (as a discontinuity theoretically has energy at all frequencies). The downside of using windows in this context is that the frequency domain data tends to smear slightly due to the wider main lobe of the window's frequency response. It is noted, due to the convolution property of Fourier transforms, multiplication in one domain is convolution in the other. By multiplying a given data record by a window, the frequency response is convolved with the frequency response of the window. Without applying a data taper, the default window is a rectangular window (due to a finite number of samples) whose frequency response has a narrow main lobe and large side lobes. The narrow main lobe allows for better resolution of events but the large side lobes introduce bias into the frequency response. By using a data taper, the resolution is reduced due to a larger main lobe but much smaller side lobes reduce bias in the frequency response.

For similar reasons, windows are preferably applied to the frequency domain measurements prior to compensation. However, in the frequency domain this may be perceived as a low pass filter, as the window is centered at f=0 (DC) and tapers to 0 at $f_{max}$=400 MHz. Therefore, the final compensation equation can be defined as:

$$\Gamma(k) = \frac{1}{N} \text{Re}\{C(f)R(f)h(f)\} \quad (11)$$

where h(f) is the aforementioned window. Equation (11) advantageously allows observing the crosstalk values without attenuation or dispersion. This distortion compensation step significantly improves the disclosed connector detection technique as attenuation can bury crosstalk in noise.

Figure 5:
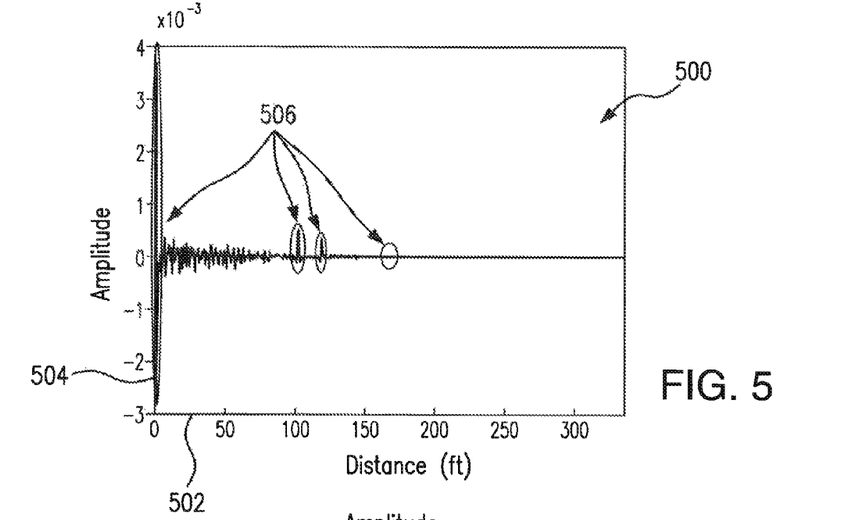
FIG. 5 is a graph illustrating uncompensated TDX signal, in accordance with the prior art.

FIG. 5 is a graph illustrating uncompensated TDX signal, in accordance with the prior art. FIG. 5 illustrates an exemplary waveform graph 500 depicting the relationship of signal amplitude and distance. The X-axis 502 represents the distance; the Y-axis 504 represents signal amplitude. In FIG. 5, amplitude values corresponding to four different connectors are graphically depicted as regions 506. The exemplary waveform graph 500 illustrates that when TDX signal is not compensated for attenuation and dispersion the increase in signal amplitude corresponding to connector crosstalk is not easily detectable.

Figure 6:
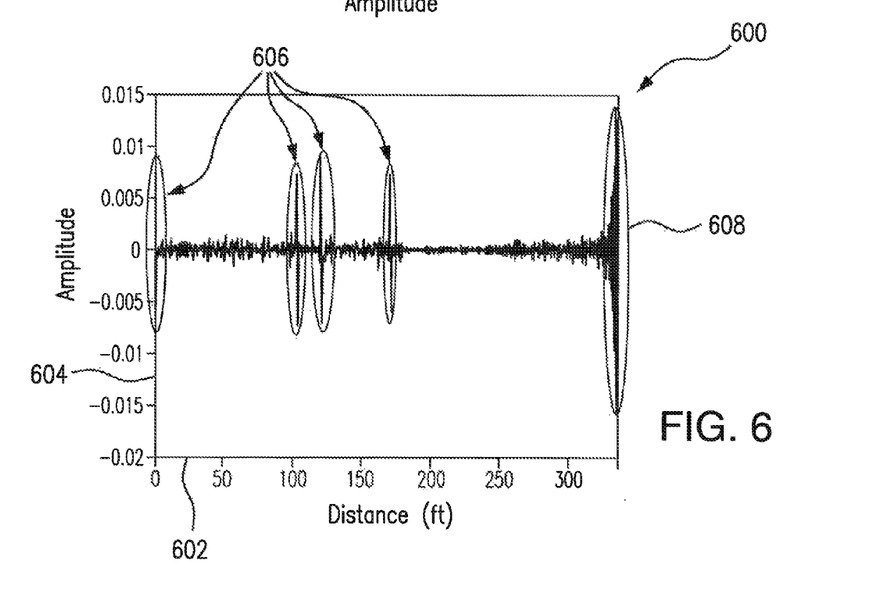
FIG. 6 is a graph illustrating TDX signal compensated for attenuation and dispersion, in accordance with an illustrative embodiment of the present invention.

FIG. 6 is a waveform graph 600 illustrating TDX signal compensated for attenuation and dispersion, in accordance with an illustrative embodiment of the present invention. Similarly to FIG. 5, the X-axis 602 represents the distance; the Y-axis 604 represents signal amplitude. Regions 606 graphically depict increasing amplitudes of an overall detected TDX signal pattern attributed to crosstalk generated by four different connectors. However, in this case, the detected TDX signal is compensated using the distortion compensation method described above. The waveform graph 600 depicted in FIG. 6 illustrates that it is easier to detect signal amplitude peaks when TDX is compensated for attenuation and dispersion. The waveform graph 600 also shows that crosstalk pulse responses are, in general, bipolar. In other words, crosstalk responses oscillate both positively and negatively. These bipolar responses may be difficult to detect robustly as the positive and negative peaks need not be equivalent in magnitude. It is therefore preferable to convert bipolar responses to unipolar ones. In one embodiment of the present invention, this is done by using the Hilbert envelope. The Hilbert envelope is the inverse Fourier transform of the autocorrelation of the single sided (positive frequency) spectrum. In other words, this envelope is the absolute value of the Hilbert transform of the signal x(t). The most efficient method (and simplest) to calculate the Hilbert transform is by setting the negative frequencies equal to zero and converting to the time domain. In other words, $$X(f) = F\{x(t)\}$$

$$X(-f) := 0$$

$$\hat{x}(t) = F^{-1}\{X(f)\} = x(t) + jx_1(t) \quad (12)$$

where $\hat{x}(t)$ is the Hilbert transformed version of x(t) and $x_1(t)$ is a 90° phase-shifted version of x(t). The Hilbert envelope, also known as the analytic signal, can be arrived at by taking the absolute value of the quantity expressed by equation (12). Thus, the Hilbert envelope is represented by the following equation:

$$\hat{x}_A(t) = |\hat{x}(t)| = |x(t) + jx_1(t)| \quad (13)$$

It should be noted that if only the positive frequencies are used during the distortion compensation method and an absolute value is used in place of the real operator, no Hilbert transform needs to be directly computed. Therefore, the final compensation equation becomes:

$$\Gamma_A(k) = \frac{1}{N}|C(f)R(f)h(f)| \quad (14)$$

Figure 7:
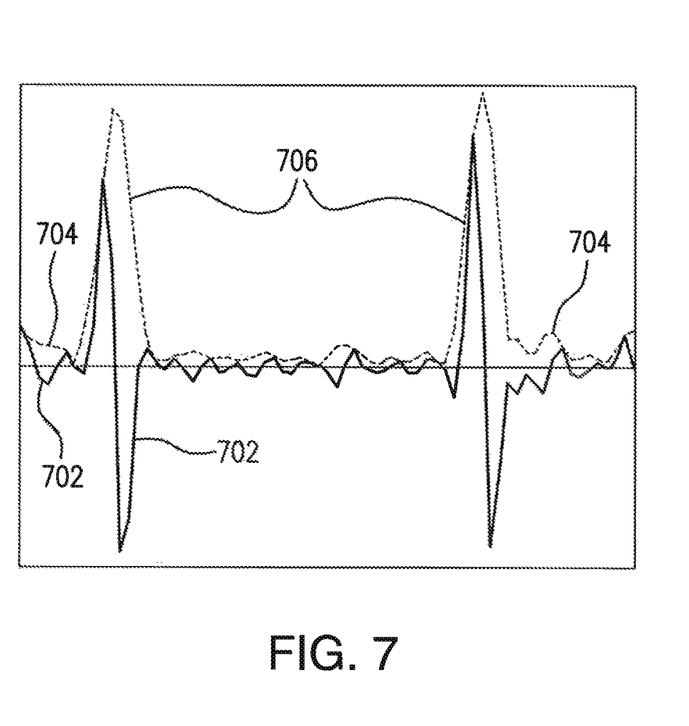
FIG. 7 is a graph showing Hilbert envelope, in accordance with an illustrative embodiment of the present invention.

FIG. 7 is a graph showing Hilbert envelope, in accordance with an illustrative embodiment of the present invention. FIG. 7 depicts both a bipolar signal waveform 702 which oscillates both positively and negatively and a unipolar signal waveform 704 which includes only positive frequencies. Hilbert envelopes are depicted as regions 706. FIG. 7 illustrates that it is easier to detect amplitude peaks in the Hilbert envelope 706 than in the original signal as the peak heights of regions 706 are larger and have only positive values.

Referring back to FIG. 4, after CDX trace is generated, at 406, the test instrument may determine which pair is best for connector detection as there are twelve distinct pairs associated with this measurement. Continuing the discussion of CDNEXT with respect to conventional RJ-45 connectors, the best pairs for CDX-based connector detection are typically 201,202-203,206 and 207,208-203,206 whereas the best pairs for TDX-based detection are typically 203,206-204,205. However, this is not always the case for CDNEXT. Therefore, at 406, the test instrument preferably determines which pairs 201,202-203,206 or 207,208-203,206 are the best for connector detection purposes. In order to quantify the detection quality of each pair of wires, it is desirable to develop some measure of SNR. In one embodiment, this can be done by attempting to estimate the noise floor without the presence of signal events. This data related noise can be removed (without losing too much precision) by using a flat threshold, zeroing out the noise and calculating the energy in the remaining signal. To set the threshold, it can be speculated that connector contributions make up less than 5% of the signal as a whole. Using a normal distribution approximation, it can be assumed that 95% of the signal will be below the mean plus two standard deviations. Accordingly, the threshold can be expressed as:

$$T = \bar{\mu} + 2\bar{\sigma} \quad (15)$$

where $\bar{\mu}$ is the sample mean and $\bar{\sigma}$ is the sample variance. These quantities can be calculated from the original signal as:

$$\bar{\mu} = \frac{1}{N}\sum_{i=0}^{N-1} x(i), \quad \bar{\sigma} = \frac{1}{N}\sqrt{\sum_{i=0}^{N-1}(x(i)-\bar{\mu})^2} \quad (16)$$

Given value of T, a threshold for signal x(t) can be set, such that:

$$\tilde{x}(t) = \begin{cases} x(t), & x(t) \geq T \\ 0, & \text{otherwise} \end{cases} \quad (17)$$

Accordingly, the test instrument can calculate the signal energy for each pair, noting that the threshold is different for every pair:

$$\epsilon_j = \Sigma_{i=0}^{N-1} \tilde{x}_j(i)^2 \quad (18)$$

where j is the pair number/index. To summarize, at 406, the test instrument may choose the best pair for detecting connectors by using equation (18) and maximizing $\epsilon$ over j. The pair with the highest energy is preferably chosen.

As previously mentioned, in a particular embodiment of the present invention, two test instruments may be used to collect data, with the main unit connected to one end of the link under test and the remote unit connected to the other end of the link under test. In this particular embodiment the main and remote units may comprise either identical or substantially similar test instruments. It is further noted that detected events close to respective units tend to have high SNR values, decreasing as signal moves further away from the test instruments. Various embodiments of the present invention contemplate the utilization of these large SNR values in combination with the fact that the information provided by the main and remote units is substantially similar. However, according to an embodiment of the present invention, prior to performing connector detection step, the test instrument preferably calculates an adaptive threshold.

Referring back to FIG. 4, at 408, the test instrument may calculate an adaptive threshold based on the combination of a flat threshold and a CFAR detector. As discussed above, one of the main problems associated with detecting signal peak values is related to detecting the presence of noise in the signal. The most common solution is to set the signal threshold (i.e., flat threshold) at a certain level and disregard the remaining portion of the signal. For stationary noise, a flat threshold may be appropriate. However, when noise is variable over time or distance, a flat threshold may no longer be sufficient.

A commonly used method, intended to produce a constant false alarm rate, is referred to herein as the constant false alarm rate (CFAR) detector. The principle of the CFAR detector is to provide a threshold at each data point based on the local noise present around the so called "Cell Under Test" (CUT). By setting a threshold in this manner, non-stationary noise may be considered if the movement in the noise distribution is "slow enough".

Figure 8:
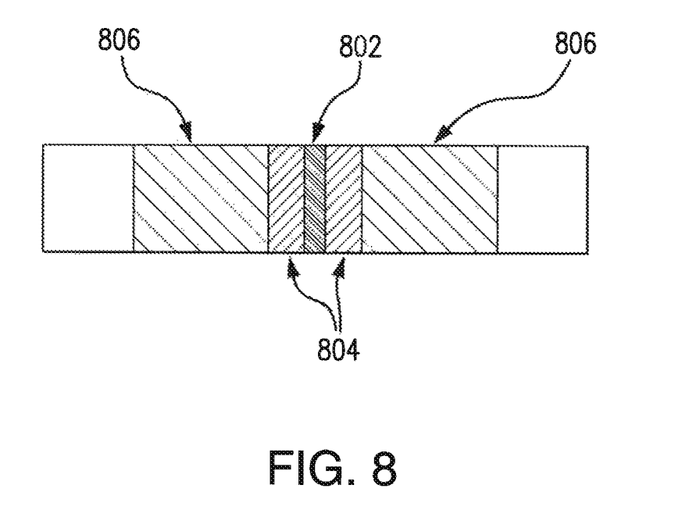
FIG. 8 is a block diagram of a constant false alarm rate (CFAR) detector, in accordance with an illustrative embodiment of the present invention.

FIG. 8 is a block diagram of a constant false alarm rate (CFAR) detector function, in accordance with an illustrative embodiment of the present invention. The illustrated CFAR function is a cell-averaging constant false alarm rate (CA-CFAR) detector and operates along the training cells 806 (data points). The guard cells 804 are used to prevent from factoring the events present at the CUT 802 into the training cells 806. According to this method, it is preferable to choose the number of training cells 806 such that the noise distribution present in the training cells 806 is substantially fixed. Given this information, the CFAR detector function can set an adaptive threshold based on finding the sample mean in the training cells 806 for each CUT 802 and multiplying the result by particular factor dependent upon the false alarm rate (probability). It is known in the art that the optimal factor based on CA-CFAR can be calculated using the following equation:

$$\alpha = N\left(P_{FA}^{-\left(\frac{1}{N}\right)} - 1\right) \quad (19)$$

where N is the number of training cells 806 and $P_{FA}$ represents the probability of false alarm.

Figure 9:
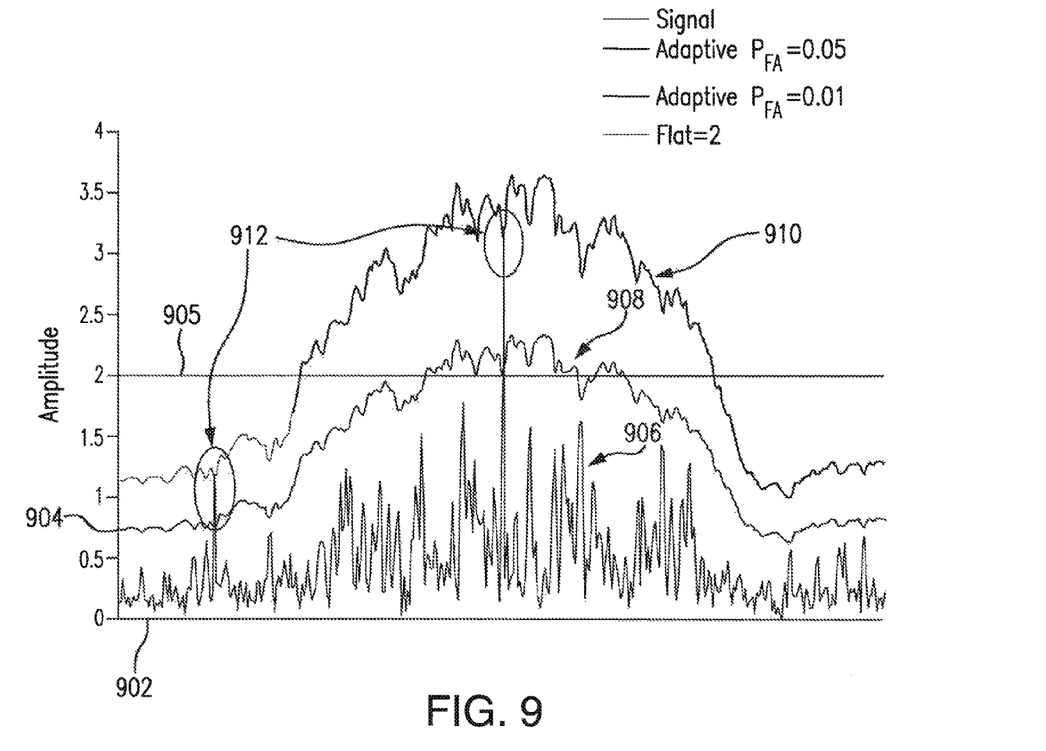
FIG. 9 illustrates a comparison between the flat and adaptive thresholds, in accordance with an illustrative embodiment of the present invention.

FIG. 9 illustrates a comparison between the flat and adaptive thresholds, in accordance with an illustrative embodiment of the present invention. The X-axis 902 represents the distance; the Y-axis 904 represents signal amplitude. First waveform graph 906 in FIG. 9 represents a discrete signal, second waveform graph 908 represents adaptive threshold with $P_{FA}=0.05$, third waveform graph 910 represents adaptive threshold with $P_{FA}=0.01$ and a line 905 represents a flat threshold. Given the two sample events present, FIG. 9 illustrates that the adaptive threshold 908, 910 has the potential for improved performance over flat threshold 905. In FIG. 9, amplitude values corresponding to two detected events are graphically depicted as regions 912. It can be seen, that in the presented case the flat threshold 905 is not able to isolate both events 912 without capturing noise.

It is further noted that for the adaptive threshold to work, a reasonable threshold value should be selected. While it is highly desirable to minimize false alarms, lowering the adaptive threshold value has the undesired side effect of making it more difficult to detect the proper events 912 as well. Theoretically speaking, a $P_{FA}$ value equal to 0 has a probability of 0 of detecting events and $P_{FA}=1$ has a probability of 1 of detecting events. This observation leads to the conclusion that the probability of detecting events is directly related to $P_{FA}$. In other words, a CFAR detector can be selected based on the following degrees of freedom: $P_{FA}$, N and the number of guard cells. It is important to determine the correct values for those parameters in order to achieve the desired performance from the adaptive thresholds 908, 910. As shown in FIG. 9, second waveform 908 representing adaptive threshold with $P_{FA}=0.05$ captures both events 912 and third waveform graph 910 representing adaptive threshold with $P_{FA}=0.01$ misses both events 912 because its noise floor estimate values are higher than peak amplitude values corresponding to both events 912. It is noted that various embodiments of the present invention contemplate usage of other variants of CFAR detector method to calculate the adaptive threshold. Two simplest of these are modifications of the CFAR detector known as the "greatest of" (GO-CFAR) and "least of" (LO-CFAR). These techniques consider the difference in noise levels left and right of the CUT 802, where the GO-CFAR method uses the larger of the two noise floor estimates and the LO-CFAR method uses the smaller of the two.

In some embodiments of the present invention, at 408, the test instrument may also calculate a composite threshold based on the flat and adaptive thresholds described above. The distortion compensation method discussed above with reference to step 404 relies on estimation of $\alpha(f)$ and $\beta(f)$ for the link (i.e., cable) under test, where $\alpha(f)$ is the attenuation constant and $\beta(f)$ is the phase constant. However, these values are not dynamically calculated, but rather being estimated based, for example, on various characteristics of the cable. This estimation has inherent error in precision in generating the proper distortion compensation parameters. Due to the exponential growth of correction from $\alpha(f)$, any estimation error tends to be compounded as distance of the cable under link increases. In addition, points at the remote end of the cable under test tend to be buried in noise generated from measurement noise of the test instrument. Even with distortion compensation, the noise floor tends to rise as signal progresses along the length of cable as depicted by region 608 in FIG. 6. This non-stationary nature of the noise floor warrants the use of the adaptive threshold.

However, in determining the estimated local noise floor, large point sources corresponding to connectors may be present. These sources may increase the estimate value of the noise floor beyond accurate levels. In order to avoid this problem, all data points above a flat threshold may be set to be equal to the sample mean of the signal. An appropriate choice of flat threshold is the threshold $T_F$ expressed by equation (15) above. Therefore, in order to determine the adaptive threshold signal, the equation (17) can be replaced with the following:

$$\widetilde{CDX}(t) = \begin{cases} CDX, & CDX \geq \bar{\mu} + 2\bar{\sigma} \\ \bar{\mu}, & \text{otherwise} \end{cases} \quad (20)$$

It should be noted that in a preferred embodiment, the test instrument performs this manipulation on a copy of CDX trace used for thresholding purposes, rather than the CDX trace generated at step 404. Applying adaptive thresholding to $\widetilde{CDX}(t)$ signal expressed above (by using, for example CA-CFAR detector) results in generating an adaptive threshold signal. However, due to the increasing of a noise floor as distance increases, this adaptive threshold is more useful for distances closer to the remote end of the cable under test. At smaller distances, the flat threshold $T_F$ performs rather well due to higher SNR value in the cable under test. Therefore, to accommodate both thresholds and gain the benefit of both, at 408, the test instrument may calculate the overall composite threshold by taking the pointwise maximum of the two thresholds:

$$T(k) = \max_{k=0,1,\ldots,N-1}\{T_F(k), T_A(k)\} \quad (21)$$

where $T_F$ represents the flat threshold value and $T_A$ represents the adaptive threshold. It should be noted that test instrument may use equation (21) to calculate the composite threshold if the length of the cable under test exceeds a predetermined value. In one embodiment, this predetermined value may be equal to approximately 50 ft.

Referring back to FIG. 4, at step 410, the main and remote units may attempt to find connectors in their respective portions of the link under test using adaptive thresholds described above. For instance, the main unit may detect connectors at one end (closest to the main unit) of the link under test, while the remote unit may detect connectors at the other end (closest to the remote unit). It is noted that in this embodiment, events from the respective remote ends of link under test appear backwards at both units as signal propagates away from each unit. Therefore, according to an embodiment of the present invention, at step 412, the main unit preferably obtains information related to connectors in the remote portion of the link under test from the remote unit.

Next, at 414, the main unit preferably aligns the connectors in the two signals. In one embodiment of the present invention, the main unit may use dynamic time warping (DTW) to align time domain data corresponding to the respective signals. Generally, when dealing with large amounts of data in multiple time series and trying to discern information across all the time series, data corresponding to different time series is usually not aligned in time exactly. DTW represents a well-known alignment algorithm. The DTW algorithm tries to find, given two sequences or time series, the optimum path (the optimum sequence of matching points) between their start and end points via dynamic programming techniques. Given two time series $x_1, \ldots x_N$ and $y_1, \ldots, y_M$ (of length N and M, respectively), DTW determines the position in the second sequence that the current position in the first sequence should be matched to for each point in the sequence. The end result is a pair of vectors $(q_1, p_1), \ldots (q_T, p_T)$ of length T that specify that $x_{q_i}$ and $y_{q_i}$ occur at the same "corrected" time step. The size of T varies depending on how shifted the events in x are as compared to y. Typically, the larger the shift, the larger the value of T will be and vice-versa. By finding vectors (q, p), the two signals can be overlaid in time by using vectors (q, p) as indices into (x,y) such that x(q) and y(p) will overlap. In one embodiment, at step 414 the conventional DTW algorithm can be implemented.

Figure 10:
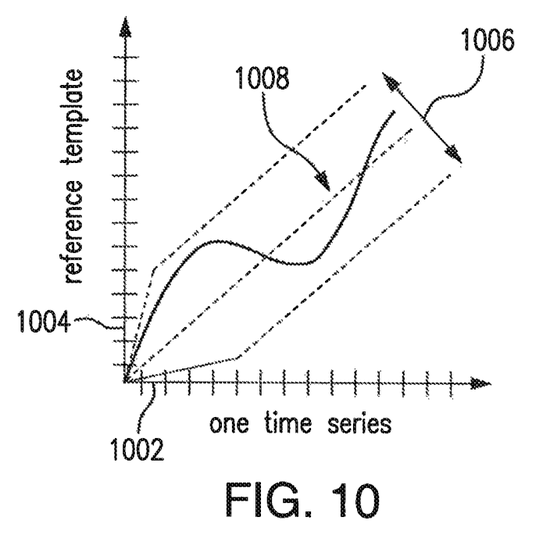
FIG. 10 graphically illustrates Dynamic Time Warping (DTW) search path principle, in accordance with an illustrative embodiment of the present invention.

FIG. 10 is a diagram showing the concept of DTW, in accordance with an illustrative embodiment of the present invention. Since DTW is a well-known process, the concept of DTW is graphically shown in FIG. 10, with a detailed explanation being omitted. In one embodiment, the X-axis 1002 represents the time domain data collected by remote unit; the Y-axis 1004 represents reference template data, which may comprise time domain data collected by the main unit. DTW uses dynamic programming optimization techniques to achieve some degree of enhanced temporal alignment. The identity time warp waveform 1008 of FIG. 10 is achieved through the "stretching" and "shrinking" in time by DTW to make one time domain data best match the second time domain data. FIG. 10 also graphically depicts maximum bandwidth 1006, which may be used by the DTW algorithm to ensure that the path does not "warp" too far if measurements have been collected by a single test instrument rather than both main and remote units. It is noted that other well-known time-alignment techniques, such as, but not limited to, Hidden Markov Models (HMMs) may be employed in step 414 as well.

Referring again to FIG. 4, at step 416, the main unit preferably combines time domain data collected by the main and remote units based on the time-alignment performed at step 414. The combined aligned time domain data yields better results since it is possible for a single test instrument to miss at least some connectors at the remote end of the cable, as the SNR value is substantially smaller in that portion of the cable under test.

Figure 11:
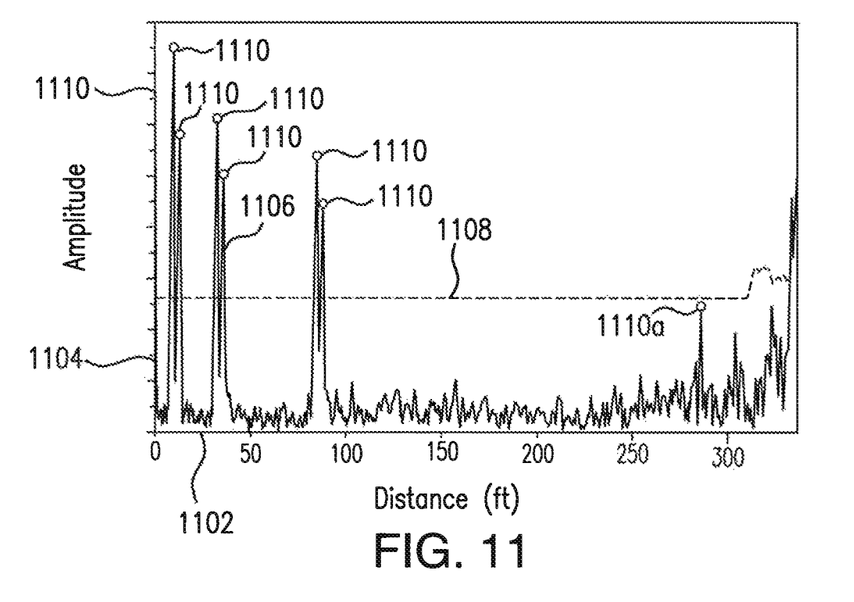
FIG. 11 graphically illustrates a potential problem with estimating connector locations based on signal measurements collected by a single test instrument, in accordance with an illustrative embodiment of the present invention.

FIG. 11 graphically illustrates a potential problem with estimating connector locations based on signal measurements collected by a single test instrument, in accordance with an illustrative embodiment of the present invention. Similarly to FIGS. 5 and 6, the X-axis 1102 represents the distance; the Y-axis 1104 represents signal amplitude. The waveform graph 1106 represents a plurality of signal measurements collected only by the main unit and the dotted line 1108 represents a composite threshold calculated in accordance with embodiments of the present invention. Regions 1110 graphically depict peaks of increasing signal amplitudes corresponding to crosstalk generated by a plurality of different connectors along the link under test. FIG. 11 shows that by using only self-collected data the main unit may fail to detect the last connector corresponding to region 1110a. However, detecting the same connector will be much easier for the remote unit, since the detectable SNR value as measured by the remote unit at that cable region should be significantly higher, thus making the connector detection much easier for the remote unit. In one embodiment, the main unit may detect connectors at step 416 by zeroing out all data points located below the composite threshold 1108 and by attempting to find the relevant remaining amplitude peaks 1110. This step may include identifying all local maxima amplitude points (such that the points around the local maxima point are all smaller in magnitude) with a possible constraint that if two local maxima points are discovered in close proximity to each other, the larger of the two local maxima points is chosen and the other is ignored. This aspect may become important as there may be large local oscillations around peaks 1110 that may factor into detection. Thus, by utilizing local maxima amplitude points the main unit may effectively create so called "dead zones" around peak values to simplify the detection practice. It should be noted that, in various embodiments, such dead zones may comprise a few feet depending on the overall length of the cable under test.

In summary, step 416 provides mapping of connector positions detected by both devices in respective remote portions of the link under test. It should be further noted that segmentation of the link under test into the first and second portions (as referred to in steps 410-416) can be done based on the overall length of the link under test estimated by the main unit.

At 418, the main unit may generate TDX trace by performing the aforementioned IDFT calculations on NEXT measurements collected at step 402. IDFT is an operation for deriving a time series data values from the given frequency domain measurements, as described above.

At 420, the test instrument preferably determines which pair of the wires is best for connector detection purpose with respect to TDX trace. According to an embodiment of the present invention, the test instrument may determine the best pair by identifying the pair with the worst margin. Typically, the pair with the worst margin will have a better SNR value and may provide a more accurate connector ranking based on the failure. Once the test instrument selects the signals corresponding to the pair of interest, the analytic waveform versions of these signals may be obtained according to the description provided above with reference to FIG. 7. In accordance with one embodiment of the present invention, this bipolar to analog conversion is done to make it easier to analyze and align the signals. It is noted that the TDX waveform generated at step 418 directly through an IDFT is uncompensated. This waveform is used to provide an accurate ranking of the contributions of each connector on the overall NEXT performance. To illustrate this point, consider that the cable link under test attenuates signals with distance. The NEXT measurements in frequency domain represent this attenuation inherently. Therefore, if NEXT measurements indicate a failure, in order to determine the cause of the failure, the attenuation factor on all the potential sources of failure should be considered.

Accordingly, at 422, to find connectors in the TDX trace, the test instrument preferably analyzes the following waveforms:

$$CDX = C^{-1}\{CDNEXT\},$$

$$TDX = F^{-1}\{NEXT\} \tag{22}$$

where $C^{-1}$ represents the distortion compensation method discussed above with reference to step 404 and where $F^{-1}$ represents the conventional IDFT method. According to an embodiment of the present invention, all connector positions in CDX trace determined at step 416 can be translated to their respective positions in TDX trace. However, prior to the mapping, the test instrument may adjust the TDX scale to correspond to the CDX scale according to the following formula:

$$TDX := TDX \cdot \frac{\max(CDX)}{\max(TDX)} \tag{23}$$

In order to align TDX signal with the CDX signal, the test instrument may employ DTW algorithm described above with reference to step 414. It is noted that for this operation the maximum bandwidth 1006 value may be on the order of 20 units. In other words, the assumption is made that the skew between CDX and TDX positions will be less than 20 units. As a result, the DTW operation, provides two warping vectors (q, p) mapping CDX(q) to TDX(p), which in turn enables the test instrument to map connector locations from the generated CDX trace to the generated TDX trace.

According to an embodiment of the present invention, once the test instrument identified all amplitude peak value of interest as described above with reference to step 416 and FIG. 11, at step 424 the test instrument preferably uses the warping vectors (q, p) to map connector locations from CDX trace to TDX trace.

Figure 12A:
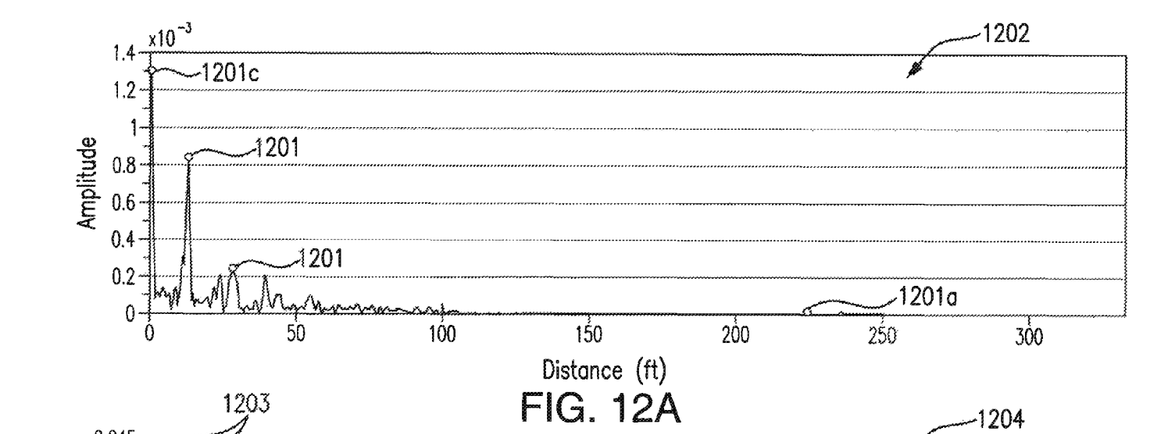
FIGS. 12A and 12B illustrate mapping of connector positions from CDX trace to TDX trace, according to some embodiments of the present invention.
Figure 12B:
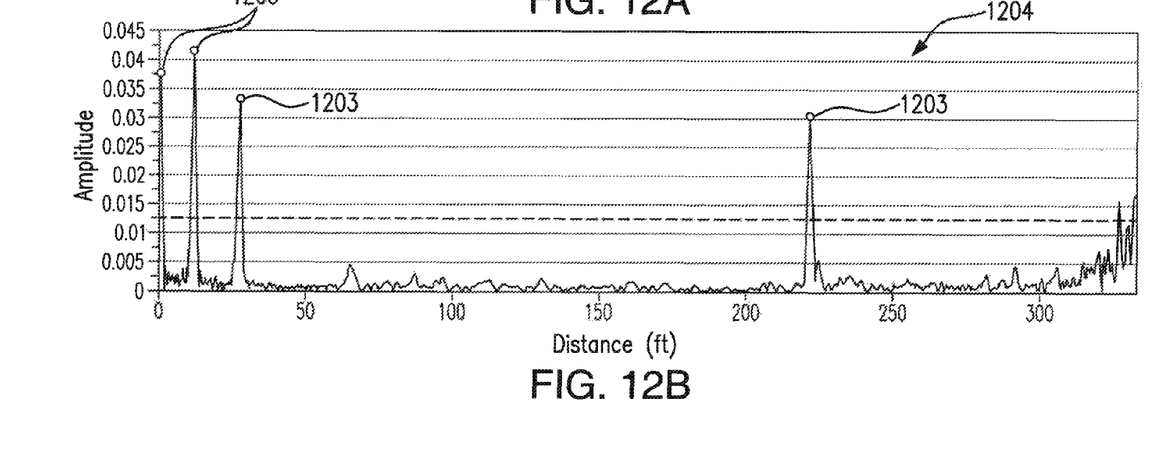

FIGS. 12A and 12B illustrate mapping of connector positions from CDX trace to TDX trace, according to some embodiments of the present invention. The waveform graph 1202 in FIG. 12A shows uncompensated TDX trace signal generated by IDFT operation based on NEXT measurements. The waveform graph 1204 in FIG. 12B shows CDX trace signal compensated for attenuation and dispersion in accordance with embodiments of the present invention. It should be noted that a plurality of dots 1203 in FIG. 12B graphically depicts the determined connector positions in CDX trace. At step 424, the test instrument maps these determined positions 1203 to positions 1201 in TDX trace 1202. Furthermore, FIG. 12A illustrates advantages of the method described herein, as the attenuation effect makes it substantially impossible to detect the last connector position 1201a through conventional thresholding means.

According to an embodiment of the present invention, at 426, the test instrument preferably ranks the connectors in accordance with their respective contribution to detected failures in the link under test. Once the test instrument determines an estimated location of each of the connectors as shown in FIG. 12B, the connector ranking step may be reduced to relative sorting of the amplitude values corresponding to each peak. In other words, connectors corresponding to the tallest peak values 1201c will have the largest impact on the failure in NEXT while connector corresponding to the smallest peak value 1201a will have the smallest impact. In one embodiment, both CDX trace 1204 and TDX trace 1202 may be presented to a user at step 104 shown in FIG. 1. The presented information allows the user to know which connector he should focus on fixing first when the test instrument detects a plurality of failures.

In summary, various embodiments of the present invention provide a method for detecting, localizing and ranking copper connectors in electrical cabling assemblies. In one aspect, for connector detection, the preferred embodiment uses CDNEXT measurements to generate a CDX trace. It has been shown that CDX has superior SNR value as compared to TDX in the majority of cases. Furthermore, various embodiments of the present invention utilize the CDX trace to determine the number of connectors. In another aspect, embodiments of the present invention employ conventional DTW method to align time domain data provided by two test instruments connected to the opposing ends of the cable under test. This alignment procedure along with the greater SNR values at respective ends and a calculation of composite threshold based on adaptive thresholding technique enables more robust detection of connectors in CDX trace. In yet another aspect, given detection of connectors in CDX, DTW may be used again to map the connector positions in CDX trace to their respective positions in uncompensated TDX trace. This step facilitates determination of the relative rank of each connector's contribution to a NEXT failure as this information can only truly be identified in the uncompensated domain. Utilization of DTW method is preferable for this mapping as the connector positions do not align in time. These aspects, collectively, yield the advanced benefits of a robust cable testing method capable of illustrating the likely causes of detected failures and their estimated positions along the link under test. Various other aspects of the invention embodiments are also presented above.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for detecting failures in electrical cabling assemblies, the method comprising:
    obtaining, by a cable test instrument, frequency domain data representing electrical characteristics of a link under test, wherein the obtained frequency domain data includes a plurality of Near-End Crosstalk (NEXT) and Common-to-Differential Near-End Crosstalk (CDNEXT) measurements;
    determining, by the cable test instrument, a number of connectors in the link under test based on the obtained frequency domain data by (1) converting the obtained frequency domain data into time domain data by generating a Time Domain Crosstalk (TDX) trace signal and generating a Common-to-Differential Crosstalk (CDX) trace signal, (2) extracting attenuation distortion and dispersion distortion from the generated TDX trace signal, (3) identifying a pair of wires in the link under test, and (4) identifying a plurality of local maxima amplitude points in the CDX trace signal corresponding to the identified pair of wires;
    determining, by the cable test instrument, an estimated location of each of the connectors along the length of the link under test; and
    ranking the connectors in accordance with their respective contribution to detected failures in the link under test by sorting the identified plurality of local maxima amplitude points in the CDX trace signals.

2. The method of claim 1, wherein the TDX trace signal is generated from the plurality of NEXT measurements using an inverse discrete Fourier transform.

3. The method of claim 1, wherein determining a number of connectors further comprises calculating a threshold value adaptive to level fluctuations of noise contained in the converted time domain data.

4. The method of claim 3, wherein calculating a threshold value further comprises calculating a composite threshold based on the level fluctuations of noise contained in the converted time domain data and based on a predetermined flat threshold value.

5. The method of claim 1, wherein the step of determining a number of connectors further comprises:
    determining a first number of connectors in a first portion of the link under test using a first cable test instrument;
    determining a second number of connectors in a second portion of the link under test using a second cable test instrument; and
    aligning the first number of connectors with the second number of connectors by performing a dynamic time warping (DTW) process.

6. The method of claim 1, wherein the step of determining an estimated location comprises:
    aligning estimated location of each connector in the CDX trace signal with estimated location of corresponding connector in the TDX trace signal by performing a DTW process.

7. The method of claim 1, wherein obtaining frequency domain data comprises measuring a plurality of scattering parameters.

8. The method of claim 1, wherein extracting attenuation distortion and dispersion distortion from the converted time domain data comprises converting bipolar crosstalk pulse responses into unipolar crosstalk pulse responses.

9. A computer-implemented method for detecting failures in electrical cabling assemblies, the method comprising:

transmitting a first test signal into a link under test by a first cable test instrument connected to a first end of the link under test and transmitting a second test signal into the link under test by a second cable test instrument connected to a second end of the link under test, wherein the first end of the link under test opposes the second end of the link under test;

obtaining, by the first and second cable test instruments, frequency domain data representing electrical characteristics of the link under test, wherein the obtained frequency domain data includes a plurality of Near-End Crosstalk (NEXT) and Common-to-Differential Near-End Crosstalk (CDNEXT) measurements;

determining, by the first cable test instrument, a number of connectors in the link under test based on the obtained frequency domain data by (1) converting the obtained frequency domain data into time domain data by generating a Time Domain Crosstalk (TDX) trace signal and generating a Common-to-Differential Crosstalk (CDX) trace signal, (2) extracting attenuation distortion and dispersion distortion from the generated TDX trace signal, (3) identifying a pair of wires in the link under test, and (4) identifying a plurality of local maxima amplitude points in the CDX trace signal corresponding to the identified pair of wires;

determining, by the first cable test instrument, an estimated location of each of the connectors along the length of the link under test;

ranking, by the first cable test instrument, the connectors in accordance with their respective contribution to detected failures in the link under test by sorting the identified plurality of local maxima amplitude points in the CDX trace signals; and displaying, by the first cable test instrument, diagnostic information related to the link under test.

10. The method of claim 9, wherein the TDX trace signal is generated from the plurality of NEXT measurements using an inverse discrete Fourier transform.

11. The method of claim 9, wherein determining a number of connectors further comprises:

determining a first number of connectors in a first portion of the link under test using the first cable test instrument;

determining a second number of connectors in a second portion of the link under test using the second cable test instrument; and aligning, by the first test instrument, the first number of connectors with the second number of connectors by performing a DTW process.

12. The method of claim 9, wherein obtaining the plurality of CDNEXT measurements comprises generating a common mode signal on a first pair of wires on a first end of the link under test and measuring a differential mode signal on a second pair of wires on the first end of the link under test, wherein the first pair of wires is different from the second pair of wires.

13. The method of claim 9, wherein the pair of wires in the link under test is identified by calculating signal energy value for each pair of wires in the link under test and selecting the pair having the highest signal energy value.

14. The method of claim 9, wherein said diagnostic information includes the generated TDX trace signal and the generated CDX trace signal.

* * * * *